United States Patent [19]

Singh et al.

[11] Patent Number: 5,052,763
[45] Date of Patent: Oct. 1, 1991

[54] OPTICAL SYSTEM WITH TWO SUBSYSTEMS SEPARATELY CORRECTING ODD ABERRATIONS AND TOGETHER CORRECTING EVEN ABERRATIONS

[75] Inventors: Rama N. Singh, Bethel, Conn.; Janusz S. Wilczynski, Ossining, N.Y.

[73] Assignee: International Business Machines Corporation, Armonk, N.Y.

[21] Appl. No.: 575,043

[22] Filed: Aug. 28, 1990

[51] Int. Cl.$^5$ .................. G02B 1/10; G02B 17/08; G02B 27/14; G02B 13/26
[52] U.S. Cl. .................. 359/355; 359/364; 359/638
[58] Field of Search ........ 350/503, 504, 505, 442–446, 350/1.2, 1.3, 1.4, 1.1, 173

[56] References Cited

U.S. PATENT DOCUMENTS

| 4,469,414 | 9/1984 | Shafer | 350/505 |
| 4,854,688 | 8/1989 | Hayford et al. | 350/416 |
| 4,896,952 | 1/1990 | Rosenbluth | 350/446 |

FOREIGN PATENT DOCUMENTS

| 2500070 | 7/1975 | Fed. Rep. of Germany | 350/442 |
| 540241 | 2/1977 | U.S.S.R. | 350/505 |
| 553569 | 5/1977 | U.S.S.R. | 350/442 |

Primary Examiner—Jon W. Henry
Attorney, Agent, or Firm—Daniel P. Morris

[57] ABSTRACT

An optical system having a substantially flat image field is disclosed. The optical system is formed from optical subsystems wherein an input optical subsystem forms an intermediate image has a curvature which compensates that from the remaining optical components of the system to result in a substantially flat image for the optical system. Preferably the optical elements preceding the intermediate image and the optical elements succeeding the intermediate image are separately corrected for odd aberrations. The optical elements preceding the intermediate image and the optical elements succeeding the intermediate image compensate for each other and result in a substantially aberration free flat image for the optical system. The optical system preferably contains an input optical subsystem and an output optical subsystem wherein the input optical subsystem is a catadioptric system and wherein the output optical system is a dioptric system. Most preferably the input optical system is a 1X catadioptric system and the output optical system is an NX dioptric system. The optical systems of the present invention are used for subquarter micron photolithography tools for microelectronic fabrication, such as scanners and steppers.

36 Claims, 6 Drawing Sheets

FIG. 1.1
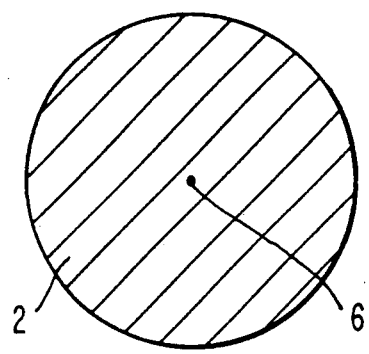
FIG. 1.2
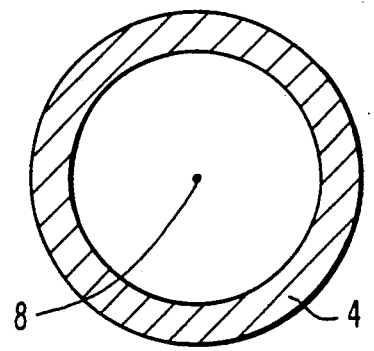
FIG. 2
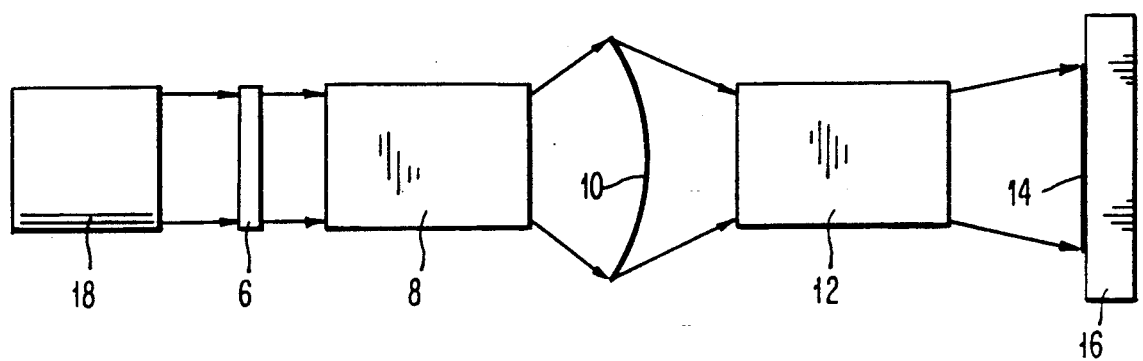

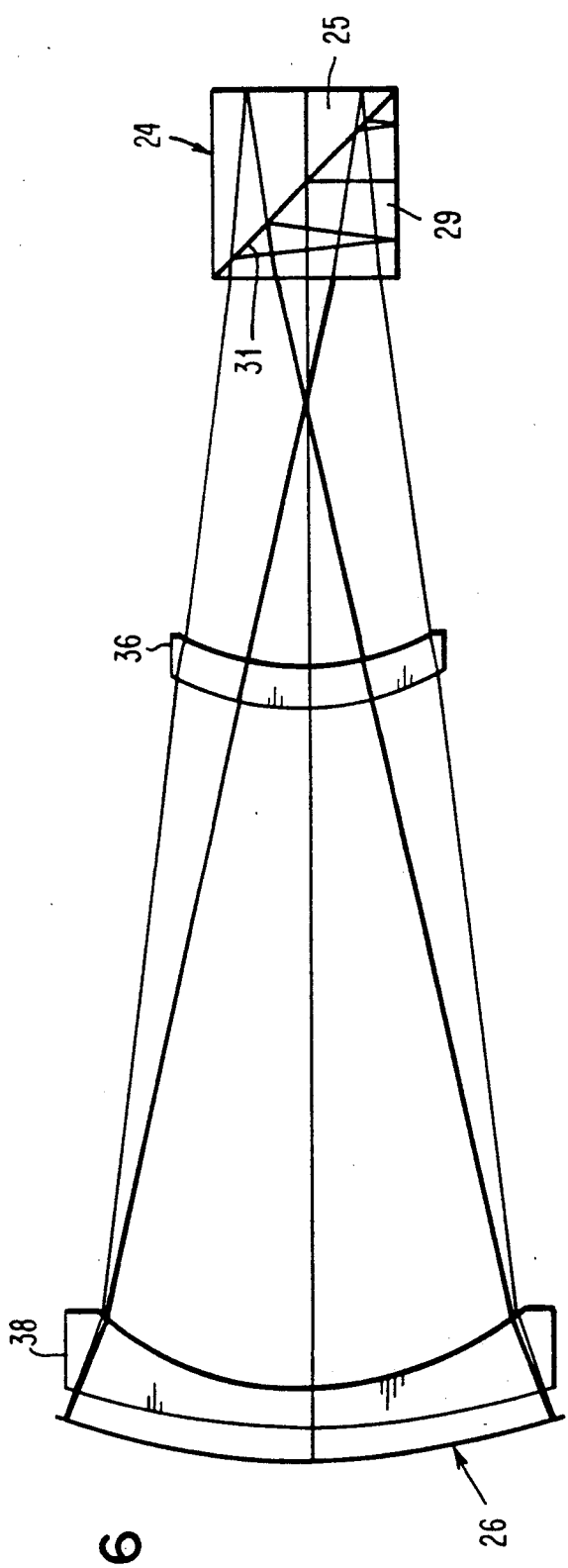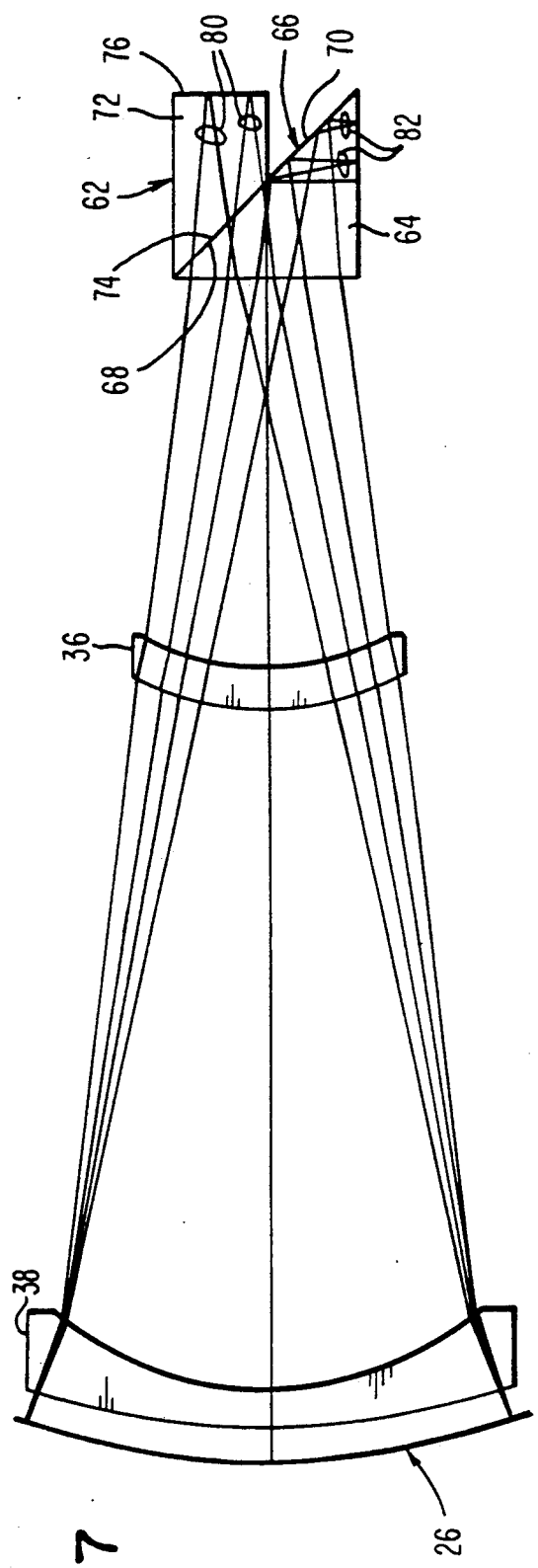

OPTICAL SYSTEM WITH TWO SUBSYSTEMS SEPARATELY CORRECTING ODD ABERRATIONS AND TOGETHER CORRECTING EVEN ABERRATIONS

FIELD OF THE INVENTION

This invention relates to an optical system having a flat image field. More particularly, this invention relates to an optical system having an input subsystem which has a curved image field which is the input object to a second subsystem, the output of which is a flat image field, wherein the first subsystem is designed to compensate for the field curvature of the second subsystem to result in the flat image field. Most particularly, this invention relates to an optical system wherein the input subsystem is a 1X system and the output subsystem is an NX system. Most particularly, this invention relates to a microelectronic lithographic lens for projecting a substantially flat and substantially aberration free image of a flat mask onto a flat semiconductor chip or semiconductor chip packaging substrate.

BACKGROUND OF THE INVENTION

In the fabrication of microelectronic components, optical systems are used to project the image of a mask onto a substrate which is typically a resist covered semiconductor chip or a resist covered semiconductor chip packaging substrate. Also, these optical systems can be used to directly ablate the image of the mask onto a substrate.

The image field of an optical system is generally curved. The degree of curvature is determined by the Petzval sum. To increase the throughput through lithographic tools, it is desirable to be able to project a large object field so that fewer exposures are required to form patterns on a microelectronic substrate. If a large object field were to be used with commonly available high resolution optical systems, the projected image will be in good focus only over a limited image field. Since microelectronic substrates, such as semiconductor chips and semiconductor chip packaging substrates are planar with increased resolution or numerical aperture the correction of the Petzval sum becomes more and more difficult.

One solution to this problem is to use a curved substrate which has a curvature corresponding to the field curvature of the optical system. This is a not a realistic solution for fabrication of microelectronic components, since these components are planar. Alternatively, a mask having a curvature which is the negative of the curvature of the optical system can be used to result in an output image field which is substantially flat. This solution is also not realistic since the creation of a curved mask would be costly and require special tooling to fabricate.

It is an object of the present invention to provide an optical system where a substantially flat and substantially aberration free image field is projected onto a substantially flat planar surface.

In accordance with the present invention, an optical system having the desired reduction ratio 1X for projecting a reduced image of a mask is provided. For this optical system, preferably a 1X projection optical subsystem is provided which projects an image of the substantially flat mask, wherein the image has the opposite curvature of the reduction NX subsystem and thereby the image field of the reduction subsystem is substantially flat.

U.S. Pat. No. 4,812,028 to Matsumoto described a reflection type reduction projection optical system for optical lithography. For the Matsumoto system consisting of a plurality of monocentric reflecting and refracting surfaces and at least one aplanatic refracting surfaces. The Petzval sum of all the aplanatic refracting surfaces together and of all the remaining reflecting and refracting surfaces is corrected independently of each other. In contradistinction, the Petzval sum according to the present invention, is corrected by compensation of the field curvature of the input subsystem with that of the output subsystem resulting in a field compensated design. Also, the input and the output subsystems are essentially separately corrected for the odd aberrations, such as coma and distortion. But the even aberrations, such as spherical aberration, astigmatism and field curvature are substantially corrected by compensation between the subsystems.

In the Matsumoto system, all refracting and reflecting surfaces except the aplanatic surface operate in substantially the 1X monocentric mode which is not true in the system of the present invention. Both the systems of the present invention and Matsumoto's system have an intermediate image. The systems of the present invention present a curved intermediate image preferably formed by a 1X input subsystem to serve as a curved input to an output NX subsystem. This approach reduces the burden of field correction in the refractor by presenting to the refractor a compensatory curved field.

It is another object of the present invention to provide an optical system having a flat image field wherein the optical system has a 1X subsystem which provides a curved image which is the object of a second NX subsystem. The output of the combined system is a substantially aberration free and flat image field with very high resolution.

It is another object of the present invention to substantially correct for odd aberrations separately in each subsystem.

It is another object of the present invention to substantially correct for even aberrations by compensating the even aberrations of one subsystem with even aberrations in the other subsystem.

These and other objects, features and advantages of the present invention will be readily apparent to those of skill in the art from the following specification and the appended drawings.

SUMMARY OF THE INVENTION

In its broadest aspect the present invention is an optical system having a substantially flat object field and a substantially flat image field.

In more particular aspect of the present invention, one optical subsystem compensates for the field curvature of a second optical subsystem to form the substantially flat image field.

In another more particular aspect of the present invention, one optical subsystem provides a focused image of an object on an image surface which has a curvature that is substantially the opposite of the field curvature of the second optical subsystem, so that the output of the second optical subsystem is a substantially flat image field.

In another more particular aspect of the present invention, each subsystem is separately corrected for the odd aberrations, such as coma a distortion.

In another more particular aspect of the present invention, the even aberrations of the subsystems, such as spherical aberration, astigmatism and field curvature are compensated by each subsystem.

In another more particular aspect of the present invention, one of the optical subsystems is a 1X input optical system and the other optical subsystem is an NX output optical subsystem.

In another more particular aspect of the present invention, the input optical subsystem is a catadioptric subsystem and the output optical subsystem is a dioptric subsystem.

In another more particular aspect of the present invention, between the input optical subsystem and the output optical subsystems there is an air-spaced lens group which does reimaging of the primary stop.

In another more particular aspect of the present invention, the air-spaced lens which is used for reimaging the primary stop into the dioptric system has the effect of providing image space telecentricity.

In another more particular aspect of the present invention, one or more fold mirrors can be used to make the system more compact.

BRIEF DESCRIPTION OF THE DRAWINGS

FIG. 1.1 is a schematic representation of a full field image.

FIG. 1.2 is a schematic representation of a ring field image.

FIG. 2 is a schematic diagram of an optical system according to the present invention.

FIG. 6 shows how the beam splitting cube of the catadioptric 1X system of FIG. 4 is used to image a mask by showing full aperture rays.

FIG. 7 shows an alternate embodiment to the catadioptric 1X system of FIG. 4, wherein a reflecting prism combination is used to split the field in order to generate an off axis image field, such as a scanning ring or a slot image field.

DETAILED DESCRIPTION OF THE PREFERRED EMBODIMENT

Figure 3:
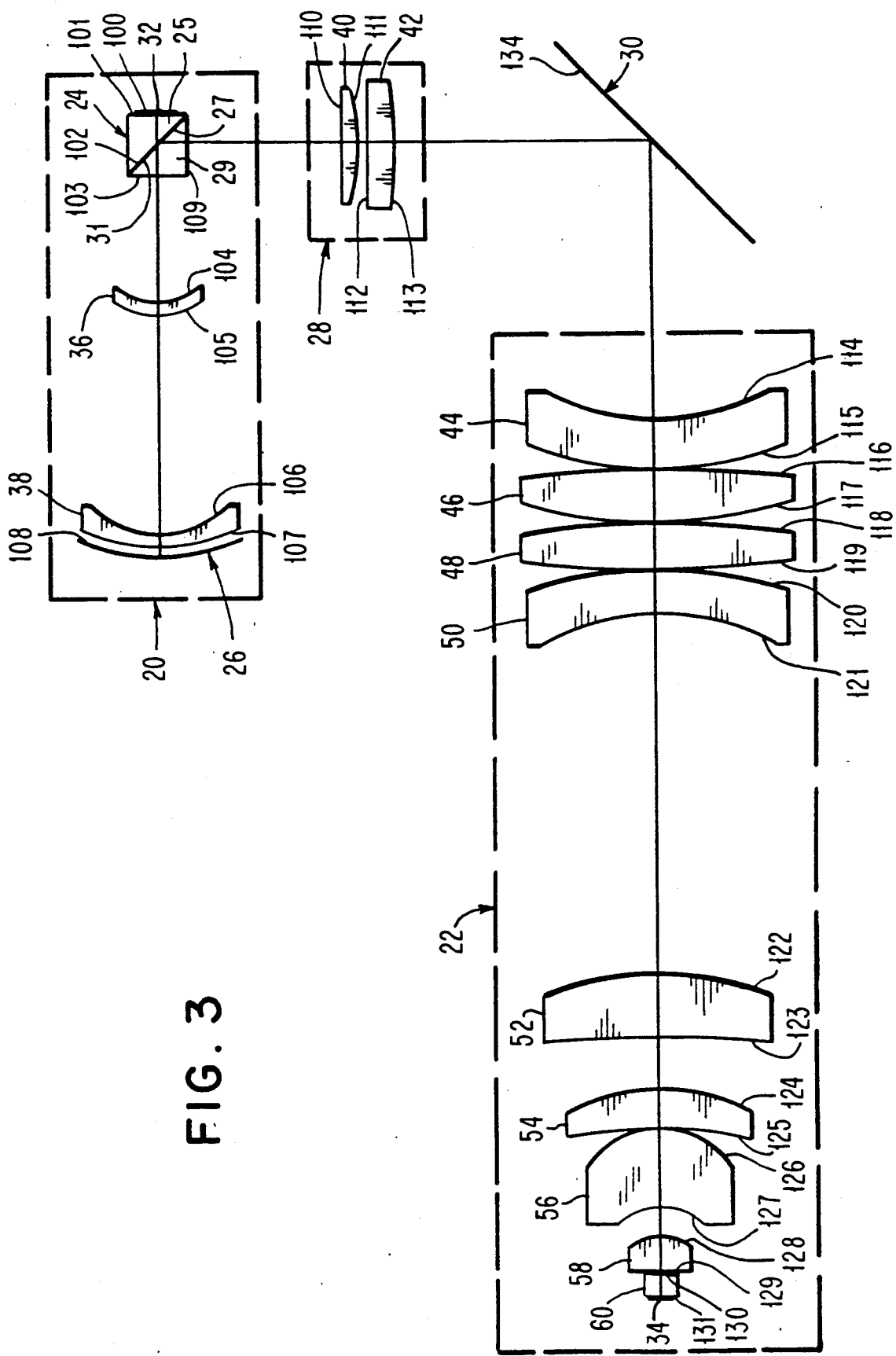
FIG. 3 is a cross-sectional view of the optical elements in a specific embodiment of the present invention.

FIGS. 1.1 and 1.2 show a comparison of the image field output of a ring field system as compared to a full field system. The shaded area 2 in FIG. 1.1 corresponds to a circular image field of a full field system having axis 6. The image field of a full field system is not limited to a circular field but it can have any geometrical shape within the circular field. The shaded area 4 in FIG. 1.2 corresponds to an image field of a ring field system having axis 8. For the ring field system to achieve a useful image area equal in size to the full field system and without scanning, the ring field image size will have to be substantially larger. Therefore, for a non-scanning ring field system to achieve the same useful image area as the full field system, the optics of the ring field system become substantially larger.

The most practical use of the system described in U.S. Pat. No. 4,812,028 to Mastsumoto is as a ring field type system as is evident from location of the object O and the image I in FIG. 1. of Matsumoto. For the Matsumoto system to achieve a useful image area comparable to that of the full field system of the present invention, the optical system of Matsumoto as shown in Matsumoto FIG. 1 must become substantially larger. Moreover, the intermediate image I of FIG. 1 of Matsumoto appears to be a flat image, which is the object, O' of subsystem S2 of the Matsumoto system of FIG. 1. Moreover, in the Matsumoto system of FIG. 1 the input object O is substantially in the same location as the output image I'. The optical system of FIG. 1 of Matsumoto is therefore of limited utility as a reduction photolithographic lens. To achieve a more practical useful system wherein the input object O and the output image I are not substantially in the same location Matsumoto introduces substantial additional complexity, shown, for example, in FIG. 6 and FIG. 7 of Matsumoto. Furthermore, mirror M2 of FIG. 1 of Matsumoto is an obstruction, for field point on axis, which prevents the systems of Matsumoto from being used in the on-axis mode, and therefore prevents these systems from achieving a high numerical aperture.

The systems according to the present invention compensate for the Petzval sum between subsystems, which makes the correction of chromatic aberration less problematic, particularly when an excimer laser is used for illumination.

FIG. 2 is a schematic representation of an optical subsystem according to the present invention. Object 6 is imaged through an optical subsystem 8 which projects a real curved image 10 which is the input to optical subsystem 12 which projects a real image 14 which is substantially flat and substantially free of aberrations. In the preferred embodiment, object 6 is a photolithographic mask and image 14 is projected onto substrate 16 which is a semiconductor chip or a semiconductor chip packaging substrate. The mask is preferably illuminated by an illuminating system 18 which transmits electromagnetic radiation, preferably ultraviolet radiation through a pattern of opaque and transparent regions on mask 6.

In the preferred embodiment, the optical system is a reduction catadioptric lens having a quarter micron or better resolution over the full bandwidth of an excimer laser source of ultraviolet radiations. In the preferred embodiment the correction of Petzval sum is obtained by combining a low numerical aperture catadioptric 1X system with a dioptric NX reduction lens of high numerical aperture and wide image field. The concave spherical mirror of the catadioptric system serves as a primary stop of the combined system. This primary stop is re-imaged into the dioptric reduction lens to obtain telecentricity in the final image space. To permit independent correction of the dioptric subsystem for odd aberrations with a small number of optical elements it is desirable to reimage the primary stop to the dioptric system so as to provide some symmetry in the distribution of optical power within the dioptric system between those portions in front of, and behind the re-imaged stop.

The catadioptric system as designed is symmetrical about the stop since the beam passes through the same lenses before being incident on the stop as it does after reflection from the stop. The intermediate image field generated by the catadioptric 1X system becomes an object field for the reduction lens. A beam-splitting cube of fused silica with appropriate coatings may be used to form an accessible image of an object, which would most commonly be a mask used to pattern a wafer located at the final image. Alternatively, an off-axis ring or slot image field may be obtained by replacing the beam-splitting cube with a field-splitting reflection prism combination, as will be described herein below. The beam splitting or field splitting takes place in a low aperture beam, eliminating all restrictions on the image space numerical aperture obtainable from designs deploying a key principle of this invention, that the Petzval sum of dioptric lens be compensated with that of a catadioptric system, as illustrated in the preferred embodiment described herein below.

This invention relates to optical systems for forming high quality images of integrated electronic circuit patterns having submicron design rules. In the preferred embodiment a catadioptric 1X system feeds a curved image field into a dioptric reduction lens. Refracting correctors with certain preferred features of curvature relationships in both the 1X and the reduction optical sub-systems of the preferred embodiment cooperate to produce a highly corrected NX image with submicron features over an extended field. The reduction factor N is preferably between about 2 and 20, and most preferably about 4 or 5.

The optical system, according to the present invention provides a substantially telecentric reduction catadioptric relay lens with diffraction limited performance, particularly over the narrow spectral bandwidths of excimer lasers, and may be specifically configured to operate at any of the different ultra-violet excimer laser wavelengths, such as 157 nm, 193 nm, 248 nm, or 308 nm.

The optical system according to the present invention permits the use of very sensitive deep UV resists and highly intense excimer laser beams for optical microlithography of microelectronic integrated circuits, permitting the sacrifice of net transmittance of the optical system, which occurs with the beam splitting technique employed in one embodiment to form an accessible and useable image, and which also results from the large total glass path needed to obtain the excellent performance of the optical system.

The optical systems according to the present invention permit the extension of the limits of the optical microlithography to quarter micron resolution, or beyond, by employing a numerical aperture of 0.7, or higher.

FIG. 3 shows a specific embodiment of an optical system according to the present invention. Optical system 20 is a 1X catadioptric subsystem. Subsystem 22 is a dioptric subsystem. Subsystem 20 contains a beam splitting cube 24 and a curved mirror 26. Between subsystem 20 and subsystem 22 there is an air spaced lens group 28. Between air spaced lens 28 and subsystem 22 there is a folding mirror 30. The folding mirror 30 is optional and serves only to reduce the size of the overall optical system.

The kinds of materials used in constructing the lens systems according to the present invention hardly have limitations. Glasses must only transmit well at the wavelengths desired for the specific application. The construction parameters for the embodiment of FIG. 3 are given in the Table. The embodiment of FIG. 3 and the Table is preferably used with illumination from a KrF excimer laser emitting light at a wavelength of about 2480 angstroms. This system is designed to operate at a reduction ratio of 4 but it is possible to reconfigure the system at any other reduction ratio without sacrificing the performance. The reduction ratio is essentially achieved by the dioptric lens. If an image space numerical aperture of 0.7 is desired at a reduction ratio of 5, the catadioptric 1X system will be working at a numerical aperture of 0.14, whereas for a reduction ratio of 4, it must work at a numerical aperture of 0.175. The compensating amounts of spherical aberration and astigmatism which must be generated to correct the aberrations of these same types originating in the dioptric lens are obtained by changing the powers of the negative meniscus 38 in front of the mirror 26 or the shell 36 in the catadioptric 1X system, whereas the concave mirror is used to take care of much of the field curvature. Although the embodiment of FIG. 3 and the Table shows meniscus 38 and shell 36 as single elements, it will be apparent to those with skill in the art that these elements may, in some circumstances, be preferably replaced with more complicated of groups of lens elements In the embodiment of FIG. 3 and the Table, all lenses are made of fused silica on account of its excellent transmission at the KrF excimer laser wavelength of about 2480 Angstroms. For applications where longer wavelengths are adequate, there exists a whole variety of usable optical glasses in the catalogues of manufacturers such as Schott Glass Technologies, Inc. Chromatic correction need not be addressed further because of the availability of line-narrowed excimer lasers. The negative meniscus lens in front of the concave spherical mirror 26 and the thin shell 38 in the 1X catadioptric lens help to reduce chromatic aberration. However, the design may be achromatised in the usual manner by combining glasses of differing dispersions to make field correcting and spherical aberration correcting modules to substitute for meniscus 38 and shell 36, in applications where such a choice of glasses exists. For use in the deep ultraviolet, the achromatization could be performed with lenses made from alkali halides, as well as fused silica. This same method of achromatization can be applied in the NX reduction subsystem.

Figure 4:
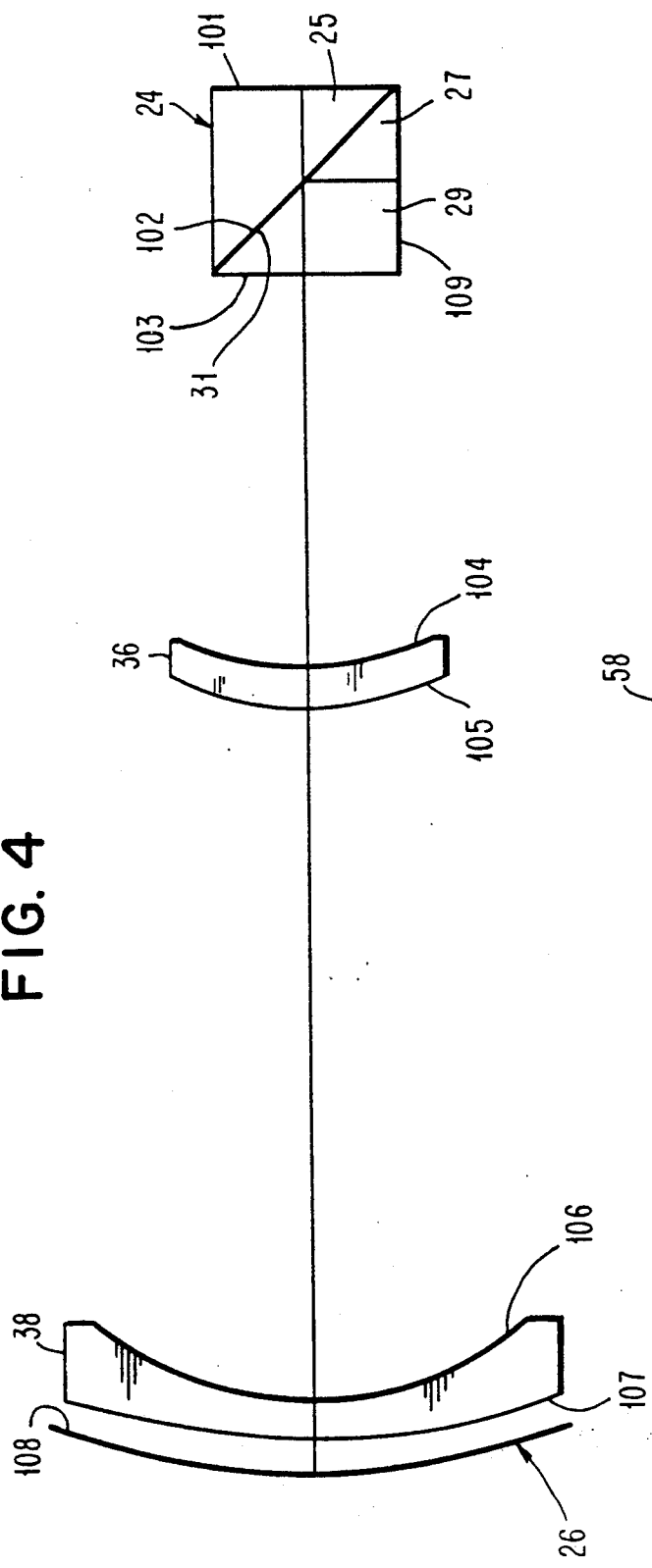
FIG. 4 is an expanded view of the catadioptric 1X system of FIG. 3.
Figure 5:
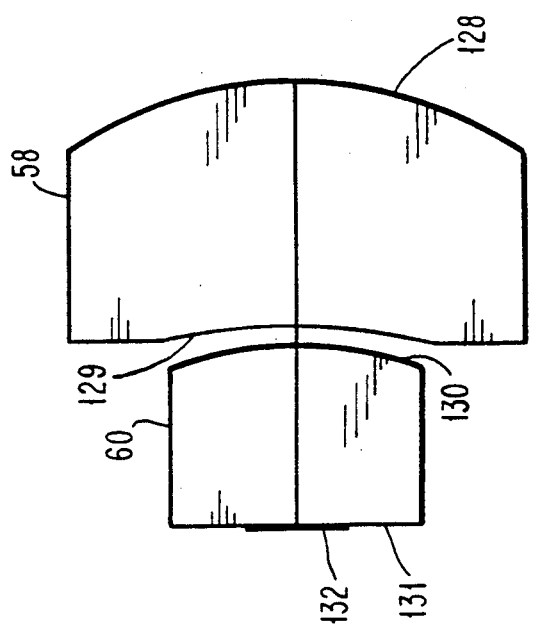
FIG. 5 shows an expanded view of two final optical components of the NX reduction subsystem of the embodiment of FIG. 3.
Figure 8:
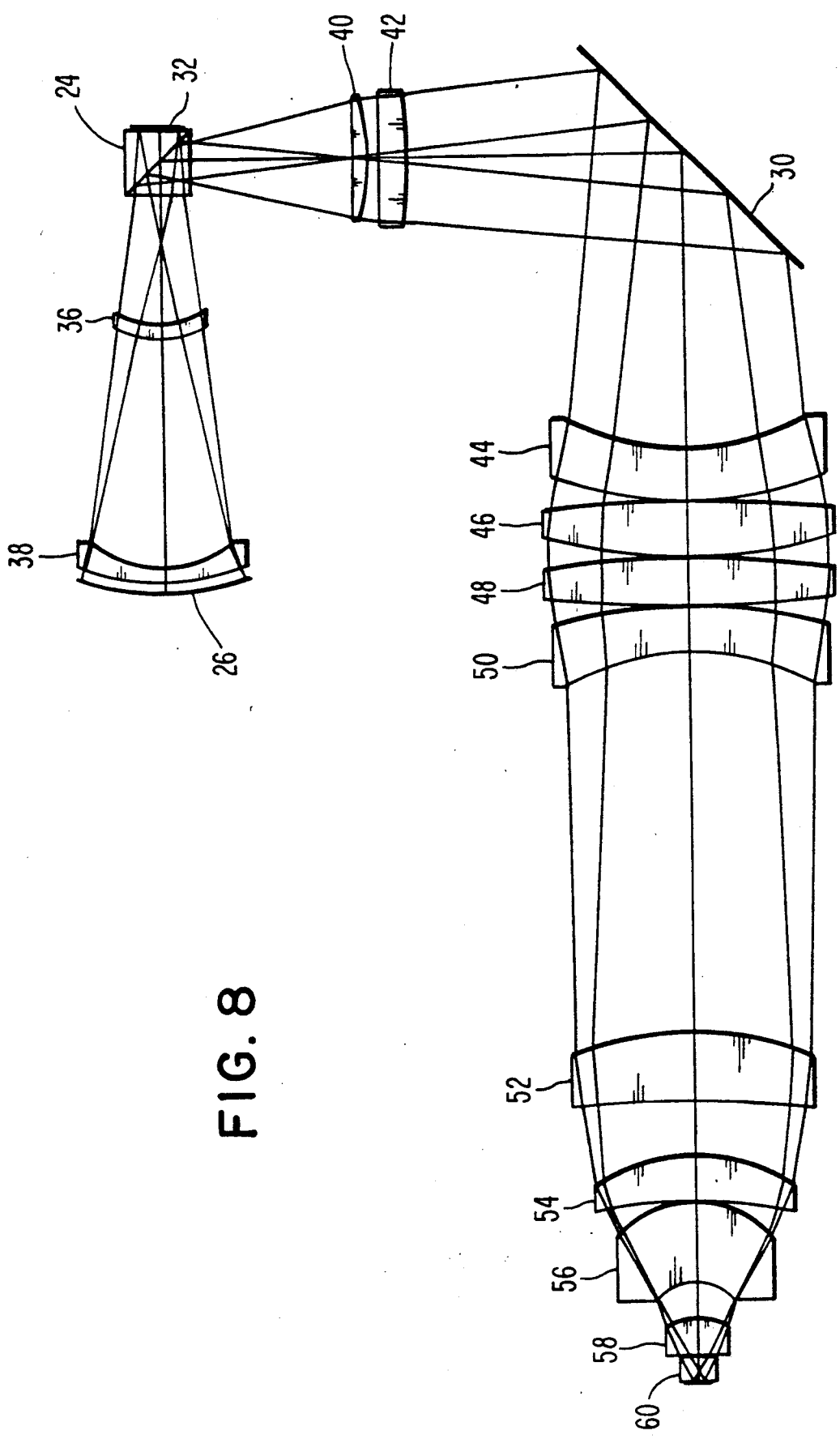
FIG. 8 is a schematic of the optical system of FIG. 3 with full aperture rays from the object to the image.

FIG. 4 is an expanded view of optical subsystem 20 of FIG. 3. FIG. 5 is an expanded view of the last two lenses at the image side 34 of the sub system 22 of FIG. 3. FIG. 8 is a shows the optical system of FIG. 3 with full aperture rays traced from the mask to the wafer operating with a beam splitter configuration to eliminate obscuration of the reduction catadioptric lens. The principle of field compensation of a dioptric lens with a catadioptric system is of general applicability in systems requiring high numerical apertures over a wide field.

The Table lists the preferred construction parameters of the embodiment of FIG. 3. for a 4X field compensated reduction catadioptric lens according to the present invention having an output numerical aperture of 0.7 and a circular field on the output image 34 of diameter 22 mm sufficient to cover a 15 mm×15 mm square area. The system of FIG. 3 with the parameters specified in the Table has a resolution better than a quarter micron.

An embodiment of the 1X catadioptric subsystem shown in FIG. 8 is the beam splitting optical element 24 of FIG. 3. Details on the design of the beam splitting surface 27 can be found in U.S. application, Ser. No. 07/185,187 filed Apr. 20, 1988 entitled, "THIN FILM BEAM SPLITTER OPTICAL ELEMENT FOR USE IN AN IMAGE-FORMING LENS SYSTEM"

to A. E. Rosenbluth, U.S. Pat. No. 4,896,952 which describes the beam splitter optical element 24 and its construction including a triangular substrate, such as a prism 25 having a substantially plane face 27 corresponding to the hypotenuse of the prism which is coated with a thin film structure having the materials and thicknesses, which affect the division of each light beam into a reflected and transmitted portion in such a way that the beam suffers no net aberration as a result of multiple reflections in the thin film structure and a second triangular substrate, such as a prism 29 having a substantially plane face, corresponding to the hypotenuse, optically bonded to the thin film structure 31 deposited on the hypotenuse of the first prism. The teaching of Rosenbluth is incorporated herein by reference. Following the teaching of Rosenbluth, a person of skill in the art can design coatings for the beam splitting surface for a particular wavelength and optical subsystem.

The order of the surfaces in the Table is for a beam from the object 32 through the beam splitting cube 24 through lenses 36 and 38 to curved reflecting surface 26 and back through lens elements 38 and 36 to reflect off of beam splitting cube hypotenuse 27 through lens elements 40 and 42 of the air space lens group 28 through the following lenses of optical subsystem 22: 44, 46, 48, 50, 52, 54, 56, 58, and 60. Folding mirror 30 is not listed in the Table since its only function is to fold the beam between air space lens group 28 and optical subsystem 22. In the Table the sign of the radius of curvature is positive if the center of curvature at the surface is either to its left or is above the surface. For example, for a beam propagating from mask 32 towards concave mirror 36, the surface 108 of concave mirror 26 has a positive radius of curvature. In the preferred embodiment surface 134 of folding mirror 30 is 60 mm from surface 113 and 650 mm from surface 114. Surface 134 of folding mirror 30 is preferably the front surface on a plate of Zerodur, coated and protected by standard techniques for reflection at the KrF or other excimer wavelength.

TABLE 1

|  | Sur-face | Radius Curvature mm | Distance to Next Surface mm | Index of Refraction to next surface n = 1.5085507 a = 1.0 |
|---|---|---|---|---|
| Mask | 100 | Planar | 5 | a |
| Cube Face | 101 | Planar | 67.925 | n |
| Cube Diagonal | 102 | Planar | 67.925 | n |
| Cube Face | 103 | Planar | 293.069 | a |
|  | 104 | 201.354 | 29.996 | n |
|  | 105 | 211.068 | 510.222 | a |
|  | 106 | 242.520 | 28.816 | n |
|  | 107 | 522.878 | 25.0 | a |
| Mirror | 108 | 516.823 | 25.0 | a |
| Cube Face | 103 | Planar | 67.925 | n |
| Cube Diagonal |  | Planar | 67.925 | n |
| Cube Face | 109 | Planar | 359.233 | a |
|  | 110 | 1329.060 | 30.005 | n |
|  | 111 | 587.498 | 25.0 | a |
|  | 112 | 25820.8 | 60.0 | n |
|  | 113 | 1064.070 | 1250 | a |
|  | 114 | 549.336 | 110.0 | n |
|  | 115 | 895.404 | 2.214 | a |
|  | 116 | −2859.931 | 125.0 | n |
|  | 117 | 1067.446 | 5.0 | a |
|  | 118 | −2007.148 | 100.0 | n |
|  | 119 | 3505.177 | 15.0 | a |
|  | 120 | −1032.353 | 100.00 | n |
|  | 121 | −536.889 | 838.341 | a |
|  | 122 | −707.878 | 150.0 | n |

TABLE 1-continued

|  | Sur-face | Radius Curvature mm | Distance to Next Surface mm | Index of Refraction to next surface n = 1.5085507 a = 1.0 |
|---|---|---|---|---|
|  | 123 | −4440.978 | 118.438 | a |
|  | 124 | −383.670 | 100.00 | n |
|  | 125 | −1196.545 | 1.0 | a |
|  | 126 | −214.168 | 175.0 | n |
|  | 127 | −118.494 | 75.0 | a |
|  | 128 | −120.095 | 75.0 | n |
|  | 129 | −233.331 | 5.0 | a |
|  | 130 | −106.809 | 55.0 | n |
|  | 131 | 699.946 | 0.5 | a |
| Target | 132 | Planar |  |  |

Figure 9:
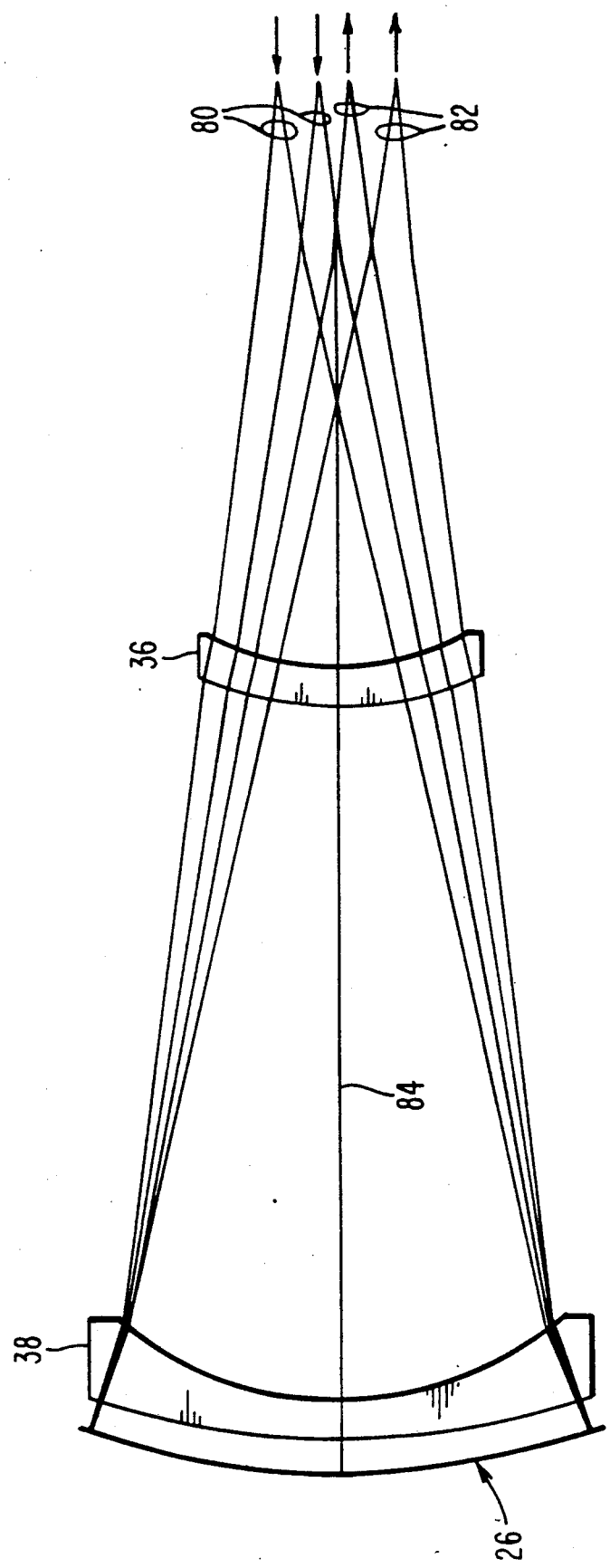
FIG. 9 shows the embodiment of FIG. 7 without the reflecting prism combination.

FIG. 7 shows an alternate embodiment to subsystem 20, shown in FIG. 3. The only difference is that beam splitting cube 24 is replaced by reflecting prism combination 62. Reflecting prism combination 62 is formed from a glass prism 64 having a diagonal 66. Half 68 of diagonal 66 is transmitting and half 70 of diagonal 66 is reflecting at the wavelength of radiation used. A second prism 72 which is truncated as shown in FIG. 9 has a diagonal 74 which is disposed against diagonal 66 of prism 64. This provides a surface 76 of prism 62 which is substantially perpendicular to the axis of the light coming from the object which is irradiated onto surface 76. Prisms 64 and 62 can be optically contacted along surface 74. The reflecting prism combination of FIG. 7 splits the field to generate an off axis scanning ring or slot image field. For the reflecting prism combination one half of the hypotenuse 66 of prism 64 is used to transmit light and the other half of the hypotenuse is used to reflect light, therefore the field is split by this surface. As shown in FIG. 7, rays 80 emerging from surface 76 are off axis. Rays 80 pass through lenses 36 and 38, reflect off concave mirror 26 and back through lenses 38 and 36 to surface 70 of hypotenuse 66 which is off axis, and reflects off of surface 70 as rays 82 which are off axis. The reflecting prism may be replaced by a plano mirror, which is located in the position of face 44. Any combination of reflecting and refractive surfaces, preferably plano surfaces, which allows two beams to separate can be used.

Since the embodiment of FIG. 7 is an off-axis system, it can be used without the reflecting prism combination and, therefore, without the bend in the optical axis between the catadioptric subsystem and the airspace lens group. Using a means to bend the optical axis permits a large mask to be used as the system object, permitting use of the optical system in a photolithographic stepper stepper apparatus. FIG. 9 shows the embodiment of FIG. 7 without the reflecting prism combination 36. Rays 80 are directed towards mirror 26 which are reflected as rays 82 without being deflected from the axis 84 of mirror 36.

Without the use of the beam splitting cube or reflecting prism combination, or the like, there will always be present an obstruction in the pupil which is not well-suited for in optical microlithography, principally on account of variations the size of obscuration with field leading to a nonuniformed exposure dose falling onto the silicon wafer. Further, the diffraction-limited impulse response obtained in the presence of an obstruction may result in poorer quality image patterns. A high resolution, reaching quarter micron, or better, is achievable with a numerical aperture of 0.7, or higher, provided by the design shown in the table. However, the field covered depends on the scale at which the lens system is built. The design of the Table is a lens with a circular field of 22 mm diameter. Calculation of the lens diameters required in the design of the table will be straight-forward to those with skill in the art. The kinds of materials used in the constructing the lens embodying in this invention hardly have limitations except that they must transmit well at the wavelengths desired for the specific application.

In summary, the invention herein is an optical system deploying the principle of field compensation of input and output optical subsystems, in particular of a dioptric lens with a catadioptric system, which is of general applicability in systems requiring high numerical aperture over a wide field. Odd aberrations are separately corrected for in the dioptric and in the catadioptric systems. Even aberrations and field curvature are compensated for between the catadioptric and dioptric systems to result in an output image which is substantially flat.

It is to be understood that the above described embodiments are illustrative of the principles of the invention. There are however, innumerable modifications and changes which may be devised by those of skill in the art which may embody the principles of the invention and fall within the spirit and scope thereof, and will be performing in a similar, satisfying manner.

We claim:

1. An optical system for projecting a substantially flat image of an object comprising:
   an input subsystem;
   an output subsystem;
   the input subsystem and the output subsystem each being separately substantially corrected for odd aberrations;
   the even aberrations of the input subsystem substantially compensating for the even aberrations of the output subsystem to form a substantially flat image field.

2. The optical system of claim 1, wherein at least one of said input optical systems and said output optical systems is a catadioptric system.

3. The optical system of claim 1, wherein said input system is a 1X system.

4. The optical system of claim 2, wherein said catadioptric system contains a stop.

5. The optical system of claim 2, wherein said input optical subsystem is catadioptric, containing a concave reflecting surface and wherein said optical system further including at least one optical element between said input and said output optical systems to image said stop within said output optical system.

6. The optical system of claim 5, wherein said at least one optical element is an air space lens group.

7. The optical system of claim 2, wherein said catadioptric system comprises:
   an optical element composed of a material capable of supporting propagation of image-forming beams of radiation;
   said optical element having at least one substantially planar surface;
   a plurality of thin-film coatings on said substantially planar surface to provide a beam reflected from and transmitted through said surface which is substantially free of aberration, distortion and apodization due to reflection from and transmission through said surface;
   a concave reflective surface for receiving a beam reflected from or transmitted through said substantially planar surface.

8. The system of claim 7, further including a lens group to provide even aberrations substantially compensating the remaining even aberrations of said output optical subsystem.

9. The system of claim 7, wherein said input lens group and said concave reflecting surface substantially correct for odd aberrations of said catadioptric system and provide an intermediate image having a predetermined field curvature.

10. The system of claim 9, wherein said input optical subsystem provides an intermediate image, said optical element separating said object from said intermediate image.

11. The system of claim 1, wherein said system has submicron resolution over the total ultraviolet bandwidth of an excimer laser.

12. The system of claim 1, wherein said system has submicron resolution at the wavelength of about 2480 Angstroms of a KrF laser.

13. The system of claim 7, wherein said thin film coatings are composed of materials having substantially uniform thickness over said substantially planar surface to produce a compensating phase distribution and a compensating amplitude distribution in said beam reflected from said substantially plane surface and in said beam transmitted through said substantially plane surface, to substantially eliminate aberrations and distortions from said substantially planar surface and the coatings thereon.

14. The system of claim 7, further including a second optical element composed of a material capable of supporting the propagation of said image-forming beam of radiation, said second optical element having at least one substantially plane surface bonded to said thin film coatings on said first optical element on which said thin film coating is layered.

15. The system of claim 14, wherein said first and said second optical elements are prisms, and said plane surface thereof are faces of said prisms, the combination of said first and second optical elements forming a beam splitting structure.

16. The system of claim 7, wherein said thin film coatings are selected from at least one of the group consisting of hafnia, magnesium floride, alumina and silicon dioxide.

17. The optical system of claim 1, further including a folding reflecting element between said input and said output optical subsystems.

18. The optical system of claim 7, wherein said optical system is a rotationally symmetric optical system.

19. The optical system of claim 1, wherein said input subsystem provides an intermediate image having a field curvature which is the negative of the field curvature of said output optical system.

20. The optical system of claim 2, wherein said catadioptric system comprises:
   a field-splitting-beam-folding element;
   a concave reflective surface for receiving a beam from said field splitting, beam folding element.

21. The system of claim 20, further including a lens group to provide substantially even aberrations compensating the even aberrations of said output optical subsystem.

22. The system of claim 20, wherein said lens group and said concave reflecting surface substantially correct for odd aberrations of said catadioptric system and provide an intermediate image having a predetermined field curvature.

23. The system of claim 22, wherein said field splitting beam folding element is a reflecting prism combination.

24. The optical system of claim 20, wherein said field splitting beam folding element is a mirror.

25. The optical system of claim 20, wherein said field splitting beam folding element is a reflecting prism combination.

26. The optical system of claim 24, wherein said optical system uses an off-axis portion of said optical system.

27. The optical system of claim 25, wherein said optical system uses an off-axis portion of said optical system.

28. The optical system of claim 26, wherein said optical system is a ring field or slot field system.

29. The optical system of claim 27, wherein said optical system is a ring field or slot field system.

30. The optical system of claim 1, wherein said optical system is a rotationally symmetric system.

31. A 4X reduction optical system having submicron resolution in the ultraviolet bandwidth and an NA of about 0.7 for projecting a substantially flat and aberration free image of an object comprising:
a concave reflecting surface;
a folding means for folding a reflected beam from said concave reflecting surface out of a path of an incident beam on said concave reflecting surface;
constructional data for surfaces between said concave reflecting surface and said folding means comprising:

| Surface From Said | Radius (About) (mm) | Distance To Next Surface (About) (mm) | Index Of Refraction To Next Surface (About) (mm) |
|---|---|---|---|
| 1. said concave reflecting | 516.8 | 25 | 1 |
| 2. | 522.9 | 28.8 | 1.5 |
| 3. | 242.5 | 510.2 | 1 |
| 4. | 211.1 | 30 | 1.5 |
| 5. | 201.3 | 293.1 | 1 |
| 6. | planar | | 1.5 |
| 7. said folding means | planar | 68 | |

| Surface From Said Folding Means | Radius (About) (mm) | Distance To Next Surface (About) (mm) | Index Of Refraction To Next Surface (About) |
|---|---|---|---|
| 1. said folding means | Planar | 68 | 1.5 |
| 2. | Planar | 359.2 | 1 |
| 3. | 1329.1 | 30.0 | 1.5 |
| 4. | 25820.8 | 60.0 | 1.5 |
| 5. | 1064.1 | 1250 | 1 |

-continued

| | | | |
|---|---|---|---|
| 6. | 549.3 | 110.0 | 1.5 |
| 7. | 895 | 2.2 | 1 |
| 8. | −2859 | 125 | 1.5 |
| 9. | 1067 | 5 | 1 |
| 10. | −2007 | 100 | 1.5 |
| 11. | 3505.2 | 5.0 | 1 |
| 12. | −1032.4 | 100.00 | 1.5 |
| 13. | −536.9 | 838 | 1 |
| 14. | 707.9 | 150.0 | 1.5 |
| 15. | −444 | 118.438 | 1 |
| 16. | 384 | 100.00 | 1.5 |
| 17. | −1197 | 1.0 | 1 |
| 18. | −214.2 | 175.0 | 1.5 |
| 29. | −118.5 | 75.0 | 1 |
| 20. | −120.7 | 75.0 | 1.5 |
| 21. | −233.3 | 5.0 | 1 |
| 22. | −106.8 | 55.0 | 1.5 |
| 23. | 700 | 0.5 | 1 |

32. The optical system of claim 29, wherein said folding means is a beam splitting cube.

33. The optical system of claim 29, wherein said folding means is a prism-reflecting combination.

34. An optical system for projecting a substantially flat output image of an object comprising:
an intermediate-image-forming optical element to form an intermediate image of said object;
an output-image-forming optical element to form said output image using said intermediate image as an intermediate object for said output-image forming optical element.
said output-image-forming optical element having a field curvature;
each of said intermediate-image-forming optical element and said output-image-forming optical separately being substantially corrected for odd aberrations;
said intermediate-image-forming optical element and said output-image-forming optical element being substantially corrected in combination for even aberrations;
said intermediate image having a field curvature which is the opposite of said field curvature of said output-image forming optical-element; and
said output image field being substantially flat and substantially aberration free.

35. The optical system of claim 34, wherein said intermediate-image-forming optical element containing a concave spherical mirror as a primary stop for said optical system and further including an airspace lens group between said intermediate-image-forming optical element, said airspace lens group imaging said primary stop within said output-forming optical element.

36. The optical system of claim 35, wherein said intermediate-image-forming optical element is a 1X system and wherein said output-image-forming optical element is a NX reduction dioptric system, said optical system having submicron resolution.

* * * * *